United States Patent [19]
Butcher

[11] 4,070,591
[45] Jan. 24, 1978

[54] ERROR CORRECTED ERROR AMPLIFIER

[75] Inventor: Daryl T. Butcher, LaHabra, Calif.

[73] Assignee: The United States of America as represented by the Secretary of the Air Force, Washington, D.C.

[21] Appl. No.: 706,414

[22] Filed: July 19, 1976

[51] Int. Cl.² .............................................. H03K 5/20
[52] U.S. Cl. .................... 307/359; 307/362; 328/147
[58] Field of Search .......... 307/235 B, 235 F, 235 H, 307/235 T, 235 K; 328/162, 165, 146, 147, 149

[56] References Cited
U.S. PATENT DOCUMENTS

| | | | |
|---|---|---|---|
| 3,313,956 | 4/1967 | Hillman | 307/235 B |
| 3,654,560 | 4/1972 | Cath et al. | 328/162 X |

*Primary Examiner*—John Zazworsky
*Attorney, Agent, or Firm*—Joseph E. Rusz; Robert Kern Duncan

[57] ABSTRACT

Any errors arising in a strobed MOS regenerative comparator error amplifier, such as off-set, characteristic changes due to radiation damage, and other circuit changes are corrected by comparing zero inputs for both the unknown and reference signal during a stabilization sample, storing any output signal present when the inputs are zero, in a D flip-flop, integrating the output signal from the D flip-flop and applying the integral back to the error amplifier to oppose the original unwanted error signal so that the output of the regenerative comparator will then be a logical true error signal depending only on the relative magnitude of the unknown and reference signals.

2 Claims, 3 Drawing Figures

ERROR CORRECTED ERROR AMPLIFIER

RIGHTS OF THE GOVERNMENT

The invention described herein may be manufactured and used by or for the Government of the U.S. for all governmental purposes without the payment of any royalty.

BACKGROUND OF THE INVENTION

The field of the invention is in the art of operational amplifiers.

Error amplifiers that compare an unknown signal with a reference signal and provide an output signal representative of the "error" between the unknown signal and the reference signal are well known. It is also known that conventional errors will occur in an error amplifier brought about by changes occurring in the characteristics of the components from aging, and total dose ionizing radiation changes such as photocurrent and photoconductivity, and the annealing of these effects. Two patents that may be of interest in regard to amplifier stabilization and error compensation are U.S. Pat. No. 3,183,450 to patentee R. N. Merington, and U.S. Pat. No. 3,541,320 to patentee W. H. Beall.

SUMMARY OF THE INVENTION

An electronic circuit is disclosed that eliminates internal errors in an error sense amplifier by feeding back into the error amplifier a voltage of such magnitude and polarity that will make the output of the error amplifier zero for zero signal input on both the unknown and reference inputs to the error amplifier. Thus, when the error amplifier makes a comparison of an unknown signal and the reference signal, the output of the error amplifier will be a logical signal depending only on the relative magnitude of the unknown and reference signals.

DESCRIPTION OF THE PREFERRED EMBODIMENT

Figure 1:
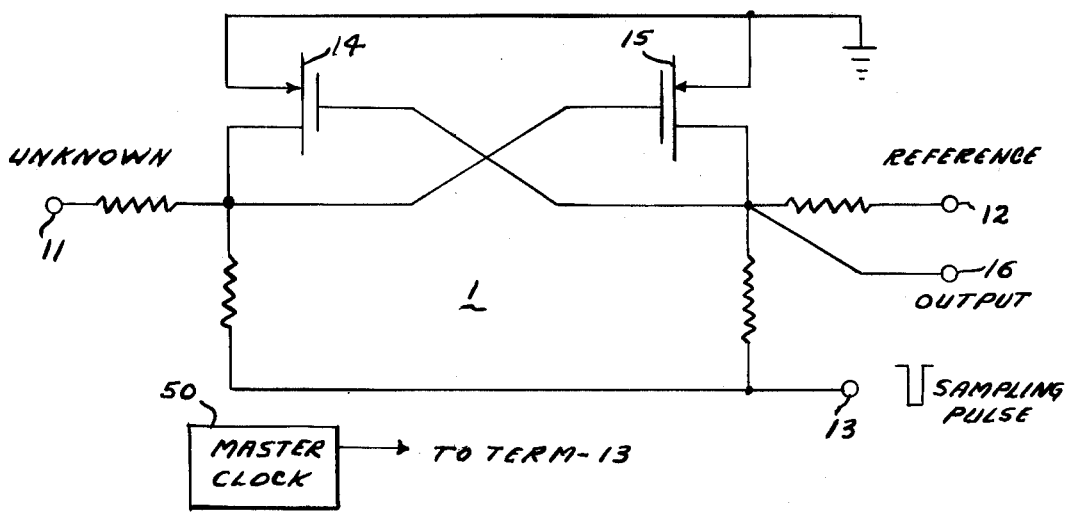
FIG. 1 is a schematic diagram of a typical prior art error amplifier.

A typical current state of the art regenerative MOS transistor pair that is used to sense error voltages or to read signals in MOS/MNOS memories is shown schematically in FIG. 1. The input signals are introduced at terminal 11 or, if of too low a level, through separate input transistor stages as is common in the art. The reference signal to which the unknown is to be compared is applied to terminal 12. Upon application of $V_{DD}$ in a pulse from clock 50 to terminal 13, the transistor pair will regenerate with transistor 14 "on" and transistor 15 "off", or transistor is "on" and transistor 14 "off" depending on the relative magnitude of the unknown and reference voltages, and provide a logic signal at output terminal 16 indicative of the relationship of the unknown signal to the reference signal. Differences in the initial MOS device characteristics or changes in gm, $V_{TH}$, or other parameters with time, temperature, or radiation damage ($\Delta V_{TH}$, $\Delta$gm) introduce an error and loss of precision in the comparison. Thus, causing a signal to appear at the output 16 indicative of an error signal, or a difference between the unknown and the reference, when in fact there should not be such an indication and the indication that is present at the output is due to an internal self-generated error signal within the error amplifier.

Figure 2:
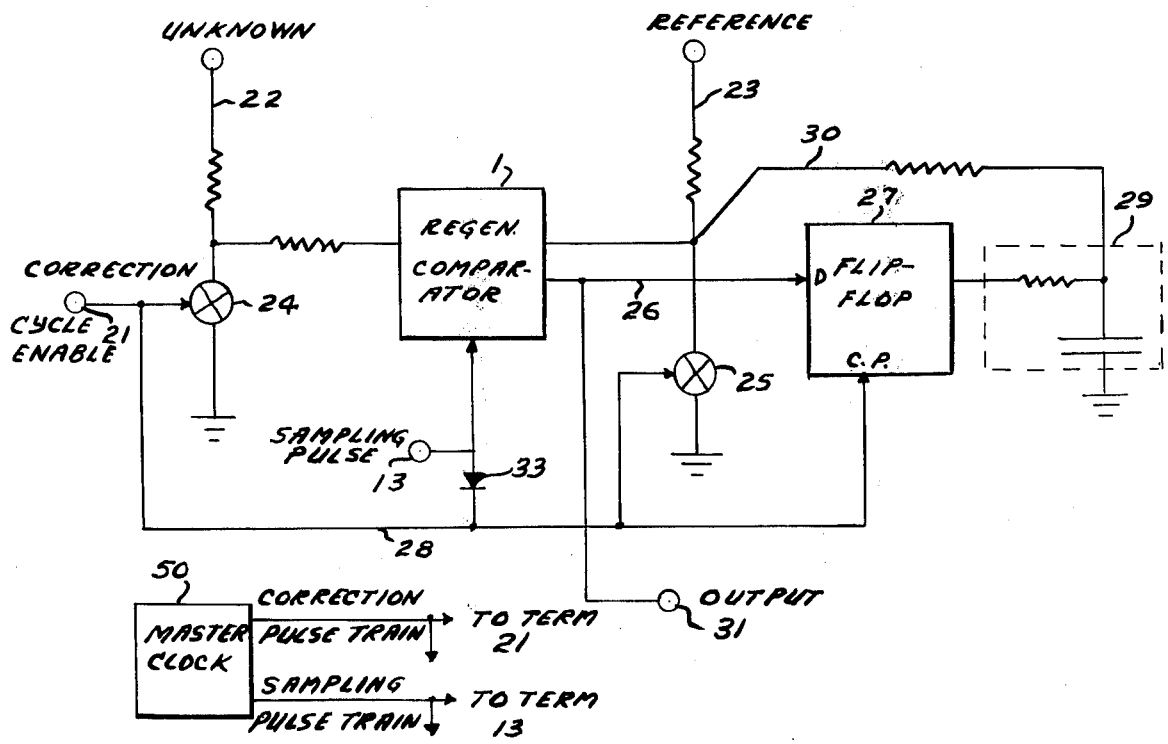
FIG. 2 is a schematic diagram of an embodiment of the invention cooperating with the prior art error amplifier.

FIG. 2 illustrates schematically the structure of the invention that provides an improved error amplifier by eliminating internal errors arising within the conventional sense amplifier 1. This is accomplished by making two comparisons in time. The first comparison effectively zeros the sense amplifier removing any output signal present when there should be none, and the second, with this correction still applied, and at a different period in time from the first, the unknown and reference signals are compared so that the output from the improved amplifier is logically true.

Figure 3:
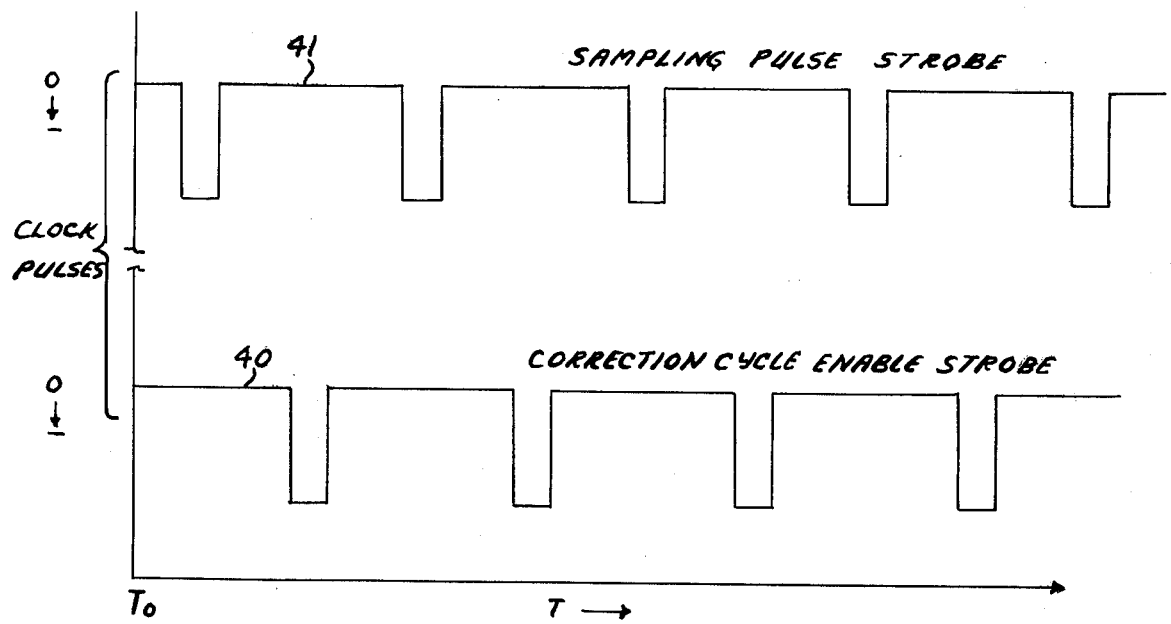
FIG. 3 is a plot of representative clock pulse trains.

The novel circuit disclosed in FIG. 2 will eliminate any mismatch errors in the strobed MOS comparator 1 by at the first comparison removing the input signals (unknown and reference) and making a stabilization sample operation. This is done by applying correction cycle enable strobe pulse (40, FIG. 3) at terminal 21 from conventional master clock 50 of the system. Conventional clock 50 supplies typical time-separated pulse trains 40 and 41 as shown in FIG. 3. Pulse train 40 removes any signals on unknown line 22 and reference line 23, by activating conventional (MOS, FET, or other) switches 24 and 25, respectively, shorting the inputs to ground. The circuit then compares zero inputs for both the unknown and reference signal during a stabilization sample. Any internal error signal on line 26, when D flip-flop 27 is strobed by this same pulse train 40 on line 28 is stored by conventional D flip-flop 27 and presented as an input signal to RC integrator 29 which integrates this error and applies the integral on line 30 into conventional error amplifier 1 to oppose the original internal error. (It can be seen that actually, the correction signal either effectively increases the reference signal or decreases it so as to compensate for the internal error.)

The circuit of FIG. 2 can best be understood by assuming that there is no initial internal error. Under this case, successive $V_{DD}$ strobes on the regenerative comparator error amplifier 1 will result in a 50% duty cycle in the D flip-flop 27, since the probability of transistor 14 or 15 conducting after regeneration is equal. When D flip-flop 27 output levels are $+V_{DD}$ and $-V_{DD}$, the integrator output is zero (and no correction is fed back to the comparator). If a mismatch exists in the comparator 1, the D flip-flop (and comparator output) will be continually in one state or the other. Integrator 29 output then will move positive or negative, and when fed back with proper polarity, will drive the output toward zero until a 50% duty cycle is obtained, effectively eliminating any unbalancing errors. When a reference and unknown are then compared, the output of regenerative comparator 1 at terminal 31 will then be a logical signal depending only on the relative magnitude of the unknown and reference. The correction signal on line 30 remains substantially constant between the correction cycle enable strobe pulses due to making the time constant of RC integrator 29 relatively long compared to the strobe repetition rate. Thus, the correction signal to the comparator is still present between stabilization strobe pulses 40 when sampling strobe pulses 41 are applied and a logical comparison is made between the unknown and the reference.

It is to be noted that substantially the only remaining possible error in the improved comparator will be that caused by the "less-than-infinite" gain in the comparator and correction feedback loop. Note also that the comparison of the unknown and the reference voltage are independent from the correction loop because of the time-shared operation of the comparator. The bandwidth of the stabilization loop should be sufficiently greater than the correction frequency as is well known in the art. It is not a requirement that the frequency of the stabilization probe signals and the sampling probe signal be of the same. Generally, it is desirable that the stabilization probe signals be a continuous train of pulses.

The unknown signals may be present continuously or intermittently, with the reference signal being present either continuously or in synchronism with the unknown signal, and since comparator 1 is time-shared with the stabilization derived independently, any internal errors in the comparator will be effectively removed. Obviously, a comparison cannot be made at the same time a stabilization pulse is present because the inputs for the unknown and the reference are shorted out at this time, nor should a sampling pulse activate the stabilization circuitry. That is, the sampling pulse to terminal 13 must not trigger switches 24 and 25 not the D flip-flop 27. This is prevented by diode 33 which passes the negative going correction strobe pulses on line 28 to the comparator 1 but prohibits the negatively going sampling pulses on terminal 13 from entering line 28. In embodiments of the invention utilizing positive going pulses, for sampling and stabilization, the polarity of the diode 33 is reversed. In some embodiments using pulses of opposite polarity for sampling and stabilization, conventional resistor isolation is used instead of diode 33.

We claim:

1. An error amplifier having an unknown signal input, a reference signal input, a signal output, and a sampling pulse signal input comprising:
   a. a regenerative comparator;
   b. a master clock providing a first and a second time-separate pulse train signal;
   c. a first switch cooperating with the said unknown signal input, the said regenerative comparator, and the said first train of clock pulses for grounding the said unknown signal;
   d. a second switch cooperating with the said reference signal input, the said regenerative comparator, and the said first train of clock pulses for grounding the said reference signal input;
   e. a D flip-flop cooperating with the said comparator, the said first train of clock pulses and providing an output;
   f. an integrator for integrating the output of the D flip-flop and providing a correction signal;
   g. means for combining the said correction signal and the said reference signal;
   h. means for applying the said combined correction signal and the said reference signal to the said regenerative comparator; and
   i. means including the said second pulse train signals and the said sampling pulse signal input, cooperating with the said regenerative comparator, whereby the said signal output from the error amplifier is representative of the comparison of the said unknown signal input and the combined reference and correction signal.

2. An error amplifier for comparing an unknown signal and a reference signal, having an unknown signal input, a correction cycle enable signal input, a sampling pulse input, a signal output, a reference signal input, and a signal ground, comprising:
   a. a regenerative comparator having a signal input, a sampling pulse input, a reference signal input, and an output;
   b. a master clock providing a time-separate correction pulse train signal and a sampling pulse train signal;
   c. a first switch having an activation input;
   d. a second switch having an activation input;
   e. a D flip-flop having a D input, a pulse input, and an output;
   f. an R-C integrator having an input and an output;
   g. means cooperating with the said first switch, the said signal ground, the said error amplifier unknown signal input, and the said regenerative comparator signal input whereby the said first switch removes any signal input of the regenerative comparator;
   h. means cooperating with the said second switch, the said signal ground, the said error amplifier reference signal input, and the said regenerative comparator reference signal input whereby the said second switch removes any signal to the said regenerative comparator reference signal input;
   i. means connecting the said regenerative comparator output to the said D input of the D flip-flop;
   j. means for connecting the said output of the D flip-flop to the said input of the R-C integrator;
   k. means for combining the said output of the R-C integrator and the said error amplifier reference signal input;
   l. means for connecting the said combined integrator output and the said error amplifier reference signal input to the said second switch and the said regenerative comparator reference signal input;
   m. means cooperating with the said error amplifier correction cycle enable signal input for connecting the said correction pulse train signal to the said activation input of the said first switch, the said sampling pulse input of the regenerative comparator, the activation input of the said second switch, and the said pulse input of the D flip-flop, whereby the said output of the R-C integrator provides an error correction signal; and
   n. means cooperating with the said error amplifier sampling pulse input, the said regenerative comparator sampling pulse input, and the said sampling pulse train for applying the said sampling pulse train to the said regenerative comparator whereby an output is provided at the output of the said regenerative comparator and the output of the said error amplifier which is an error corrected signal of the comparison of the said unknown signal and the said reference signal.

* * * * *